(12) United States Patent
Hong et al.

(10) Patent No.: US 8,624,128 B2
(45) Date of Patent: Jan. 7, 2014

(54) PRINTED CIRCUIT BOARD AND MANUFACTURING METHOD THEREOF

(75) Inventors: Ju-Pyo Hong, Suwon-si (KR); Young-Do Kweon, Seoul (KR); Jin-Gu Kim, Suwon-si (KR); Seon-Hee Moon, Seoul (KR); Dong-Jin Lee, Seoul (KR); Seung-Wook Park, Suwon-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 83 days.

(21) Appl. No.: 13/235,110

(22) Filed: Sep. 16, 2011

(65) Prior Publication Data

US 2012/0073861 A1    Mar. 29, 2012

(30) Foreign Application Priority Data

Sep. 28, 2010   (KR) .................. 10-2010-0093756

(51) Int. Cl.
*H05K 1/02*       (2006.01)

(52) U.S. Cl.
USPC ........................................... 174/259; 174/255

(58) Field of Classification Search
None
See application file for complete search history.

(56) References Cited

U.S. PATENT DOCUMENTS

| | | | |
|---|---|---|---|
| 6,787,923 B2* | 9/2004 | Tan et al. ...................... | 257/779 |
| 7,271,347 B2* | 9/2007 | Ohwaki ........................ | 174/252 |
| 7,321,099 B2* | 1/2008 | Mishiro ........................ | 174/260 |

\* cited by examiner

*Primary Examiner* — Ishwarbhai Patel
(74) *Attorney, Agent, or Firm* — McDermott Will & Emery LLP

(57) ABSTRACT

A printed circuit board and a manufacturing method of the printed circuit board are disclosed. The printed circuit board includes: a first insulation layer having a first pattern formed thereon; a first trench caved in one surface of the first insulation layer along at least a portion of the first pattern; and a second insulation layer stacked on one surface of the first insulation layer so as to cover the first pattern. The first trench is filled by the second insulation layer.

8 Claims, 6 Drawing Sheets

PRINTED CIRCUIT BOARD AND MANUFACTURING METHOD THEREOF

CROSS-REFERENCE TO RELATED APPLICATIONS

This application claims the benefit of Korean Patent Application No. 10-2010-0093756, filed with the Korean Intellectual Property Office on Sep. 28, 2010, the disclosure of which is incorporated herein by reference in its entirety.

BACKGROUND

1. Technical Field

The present invention is related to a printed circuit board and a manufacturing method of the printed circuit board.

2. Background Art

Generally, a printed circuit board is manufactured by forming a circuit pattern on the surface of a core board, stacking an insulation layer over the circuit pattern, and then forming a circuit pattern again on the surface of the insulation layer. By repeating this process, a printed circuit board having the desired number of layers can be manufactured.

In order for this printed circuit board to have sufficient product reliability during its use, the problem of the circuit pattern being peeled off from the core board and the insulation layer or being cracked needs to be resolved.

However, in the conventional printed circuit board, the core board is relatively wider and more continuous than the circuit pattern, and thus the overall rigidity and expansion of the core board has caused thermal stress in the wired circuit. In effect, this thermal stress has caused the circuit pattern to be peeled off and cracked.

SUMMARY

The present invention provides a printed circuit board and a manufacturing method of the printed circuit board that can reduce the stress occurred in the circuit pattern by reducing the thermal stress at a portion where the circuit pattern is formed.

An aspect of the preset invention features a printed circuit board that includes: a first insulation layer having a first pattern formed thereon; a first trench caved in one surface of the first insulation layer along at least a portion of the first pattern; and a second insulation layer stacked on one surface of the first insulation layer so as to cover the first pattern. The first trench can be filled by the second insulation layer.

Here, materials for the first insulation layer and the second insulation layer can be different from each other.

The printed circuit board can also include: a second pattern formed on one surface of the second insulation layer; a second trench caved in one surface of the second insulation layer along at least a portion of the second pattern; and a third insulation layer stacked on one surface of the second insulation layer so as to cover the second pattern. The second trench can be filled by the third insulation layer.

The first insulation layer can be a core board.

The first pattern can include a plurality of wired lines that are separated from one another, and the first trench can be formed between the plurality of wired lines. Moreover, distances between the plurality of wired lines may not be constant, and the width of the first trench can vary according to the distance between the plurality of wired lines.

The first pattern can include a plurality of parts that are functionally distinguishable, and the first trench can be formed along a border of adjacent parts. Also, the first trench can be formed to surround at least one of the plurality of parts.

The first insulation layer can include: a base layer; and a medium layer formed on the base layer. The first pattern and the first trench can be formed on the medium layer.

Another aspect of the present invention features a method of manufacturing a printed circuit board. The method of manufacturing a printed circuit board in accordance with an embodiment of the present invention can include: forming a first pattern on one surface of a first insulation layer; caving a first trench in one surface of the first insulation layer along at least a portion of the first pattern; and stacking a second insulation layer on one surface of the first insulation layer so as to cover the first pattern. The first trench can be filled by the second insulation layer.

The caving of the first trench can be performed by a laser processing, and materials for the first insulation layer and the second insulation layer can be different from each other.

The method can also include: forming a second pattern on one surface of the second insulation layer; caving a second trench in one surface of the second insulation layer along at least a portion of the second pattern; and stacking a third insulation layer on one surface of the second insulation layer so as to cover the second pattern. The second trench can be filled by the third insulation layer.

The first pattern can include a plurality of wired lines that are separated from one another, and the first trench can be formed between the plurality of wired lines. Moreover, distances between the plurality of wired lines may not be constant, and the width of the first trench can vary according to the distance between the plurality of wired lines.

The first pattern can include a plurality of parts that are functionally distinguishable, and the first trench can be formed along a border of adjacent parts. Also, the first trench can be formed to surround at least one of the plurality of parts.

The first insulation layer can include: a base layer; and a medium layer formed on the base layer. The first pattern and the first trench can be formed on the medium layer.

DETAILED DESCRIPTION

Figure 1:
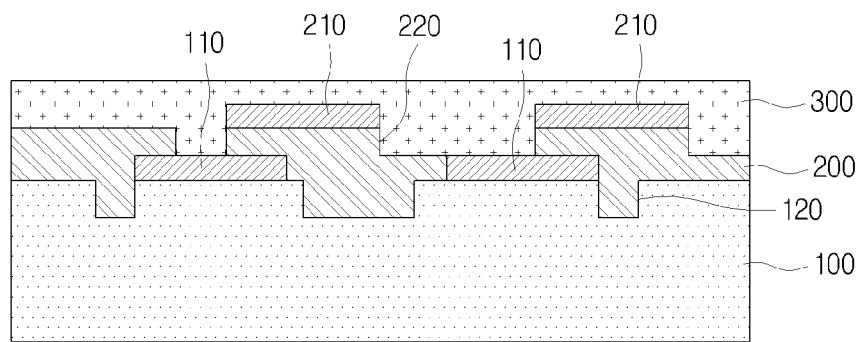
FIG. 1 is a sectional view illustrating an embodiment of a printed circuit board in accordance with an aspect of the present invention.

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the ideas and scope of the present invention. Throughout the description of the present invention, when describing a certain technology is determined to evade the point of the present invention, the pertinent detailed description will be omitted.

Terms such as "first" and "second" can be used in describing various elements, but the above elements shall not be restricted to the above terms. The above terms are used only to distinguish one element from the other.

The terms used in the description are intended to describe certain embodiments only, and shall by no means restrict the present invention. Unless clearly used otherwise, expressions in a singular form include a meaning of a plural form. In the present description, an expression such as "comprising" or "including" is intended to designate a characteristic, a number, a step, an operation, an element, a part or combinations thereof, and shall not be construed to preclude any presence or possibility of one or more other characteristics, numbers, steps, operations, elements, parts or combinations thereof.

Hereinafter, some embodiments of a printed circuit board and a manufacturing method of the printed circuit board in accordance with the present invention will be described with reference to the accompanying drawings. In describing with reference to the accompanying drawings, any identical or corresponding elements will be given same reference numerals, and description of the identical or corresponding elements will not be repeated.

FIG. 1 is a sectional view of an embodiment of a printed circuit board in accordance with an aspect of the present invention. Illustrated in FIG. 1 are a first insulation layer 100, a first pattern 110, a first trench 120, a second insulation layer 200, a second pattern 210, a second trench 220 and a third insulation layer 300.

As illustrated in FIG. 1, the printed circuit board in accordance with the present embodiment includes: the first insulation layer 100, which has the first pattern 110 formed on one surface of thereof; the first trench 120, which is caved in one surface of the first insulation layer 100 along at least a portion of the first pattern 110; and the second insulation layer 200, which is stacked on one surface of the first insulation layer 100 so as to cover the first pattern 110. The first trench 120 is filled by the second insulation layer 200.

With this embodiment, by forming the first trench 120, which is formed along the first pattern 110, on the first insulation layer 100 having the first pattern 110 formed on the surface thereof, the continuity of expansion can be locally blocked by the first trench 120 and the second insulation layer that fills up the first trench 120 in case the first insulation layer 100 is expanded by heat. As a result, the rigidity of the first insulation layer 100 can be reduced, and the stress exerted to the first pattern 110 by the expansion can be reduced.

Here, the first insulation layer 100 in which the first pattern 110 and the first trench 120 are formed can be a core board in which a reinforcing material, such as glass fiber and carbon fiber, is impregnated in an epoxy resin, and can be an individual insulation layer that carries out an inter-layer insulating function in a multi-layer printed circuit board. Moreover, the first insulation layer 100 can be a substrate or an interposer that uses ceramic or silicon.

Figure 2:
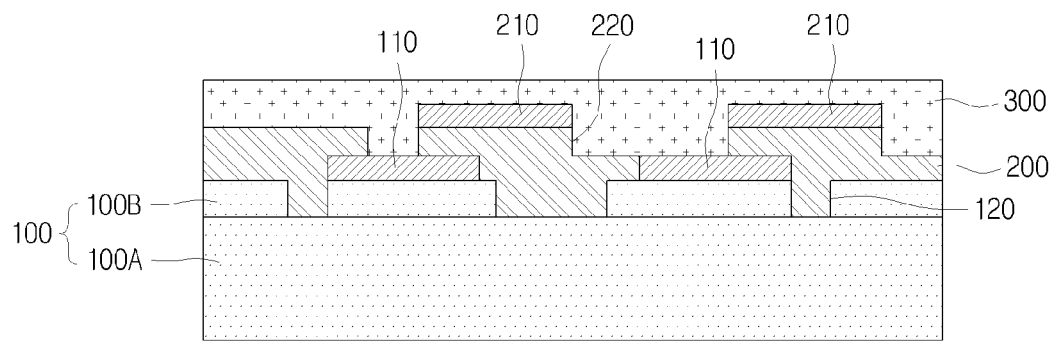
FIG. 2 is a sectional view illustrating another embodiment of a printed circuit board in accordance with an aspect of the present invention.

As illustrated in FIG. 2, the first insulation layer 100 can include a base layer 100A and a medium layer 100B, which is formed above the base layer 100A. In some cases, it may be difficult to form roughness on a surface of a board material that is used for the first insulation layer 100, and it may be difficult to form the first pattern 110 on the first insulation layer 100.

In such cases, by using a material having the structure in which the medium layer 100B is formed above the base layer 100A, as shown in FIG. 2, roughness can be readily formed on the medium layer 100B, making it possible to solve the above-described problem. Here, the first pattern 110 and the first trench 120 can be formed on the medium layer 100B.

Used for the base layer 100A can be a copper-clad laminate (CCL), a silicon substrate, an LCP substrate and the like, and used for the medium layer 100B can be polyimide, photoresistor, benzocyclobutene (BCB).

In case the materials for the first insulation layer 100 and the second insulation layer 200 are different from each other, the first trench 120 formed in the first insulation layer 100 can function as a stress buffer between the materials.

As illustrated in FIG. 1, the printed circuit board in accordance with the present embodiment can also include: the second pattern 210, which is caved in one surface of the second insulation layer 200; the second trench, which is formed on one surface of the second insulation layer 200 along at least a portion of the second pattern 210; and the third insulation layer 300, which is stacked on one surface of the second insulation layer 200 so as to cover the second pattern 210. The second trench 220 is filled by the third insulation layer 300. In other words, the structure in which the trench is formed along the pattern can be repeated in each layer of a multi-layered printed circuit board.

Figure 3:
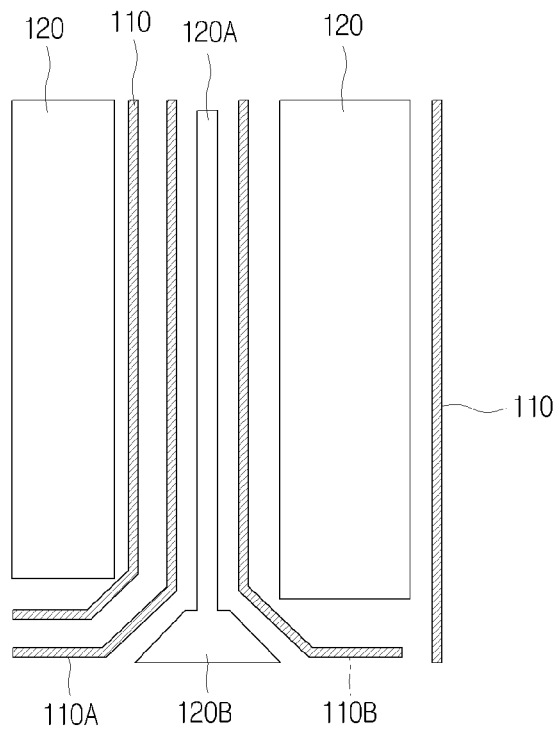
FIG. 3 is a top view illustrating an embodiment of a printed circuit board in accordance with an aspect of the present invention.

As illustrated in FIG. 3, the first pattern 110 can include a plurality of wired lines 110A, 110B that are separated from one another, and the first trench 120 can be formed between the plurality of wired lines 110A, 110B.

Here, in case the distances between the plurality of wired lines 110A, 110B are not constant, the width of the first trench 120 can vary according to the distance between the plurality of wired lines 110A, 110B. That is, if the adjacent wired lines 110A, 110B are arranged with a uniform distance and are bent to diverge from each other at one end, as illustrated in FIG. 3, the space becomes larger where the wired lines 110A, 110B are bent. Here, in order to better function as the stress buffer, the width of the first trench 120B where the space between the wired lines 110A, 110B becomes larger can be greater than that of the first trench 120A that is formed elsewhere.

Figure 4:
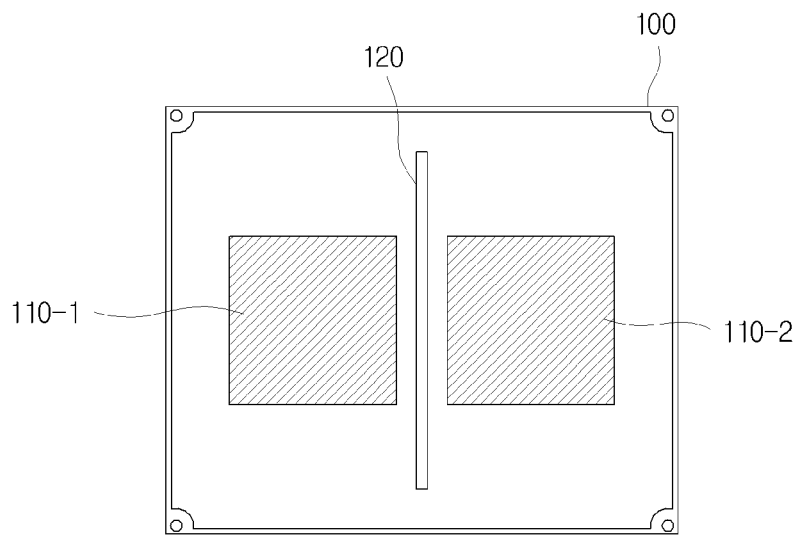
FIGS. 4 and 5 are top views illustrating another embodiment of a printed circuit board in accordance with an aspect of the present invention.

As illustrated in FIG. 4, in case the first pattern 110 includes a plurality of parts 110-1, 110-2 that are functionally distinguishable, the first trench 120 can be formed along a border between the adjacent parts 110-1, 110-2. For example, if a digital part 110-1, which transceives digital signals, and an RF part 110-2, which transceives analog signals, are arranged together on the first insulation layer 100, the first trench 120 can be formed between the two parts to mitigate the stress exerted on the two parts.

Figure 5:
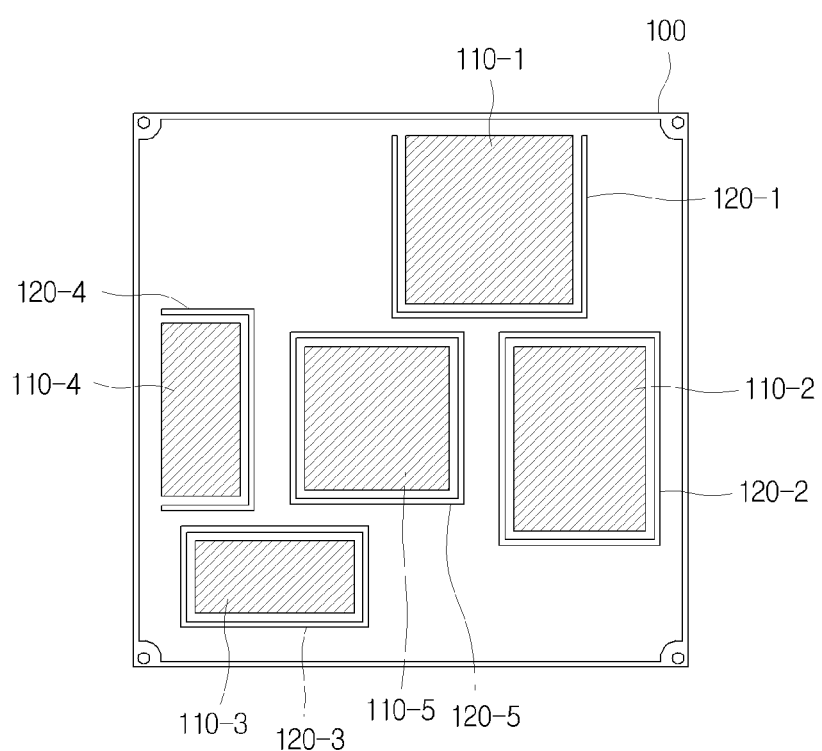

Moreover, as illustrated in FIG. 5, the first trench 120-1, 120-2, 120-3, 120-4, 120-5 can be formed to surround at least one of a plurality of parts 110-1, 110-2, 110-3, 110-4, 110-5.

Hitherto, the structure of a printed circuit board in accordance with an aspect of the present invention has been described, and hereinafter a manufacturing method of the printed circuit board will be described with reference to FIGS. 6 to 12.

Figure 6:
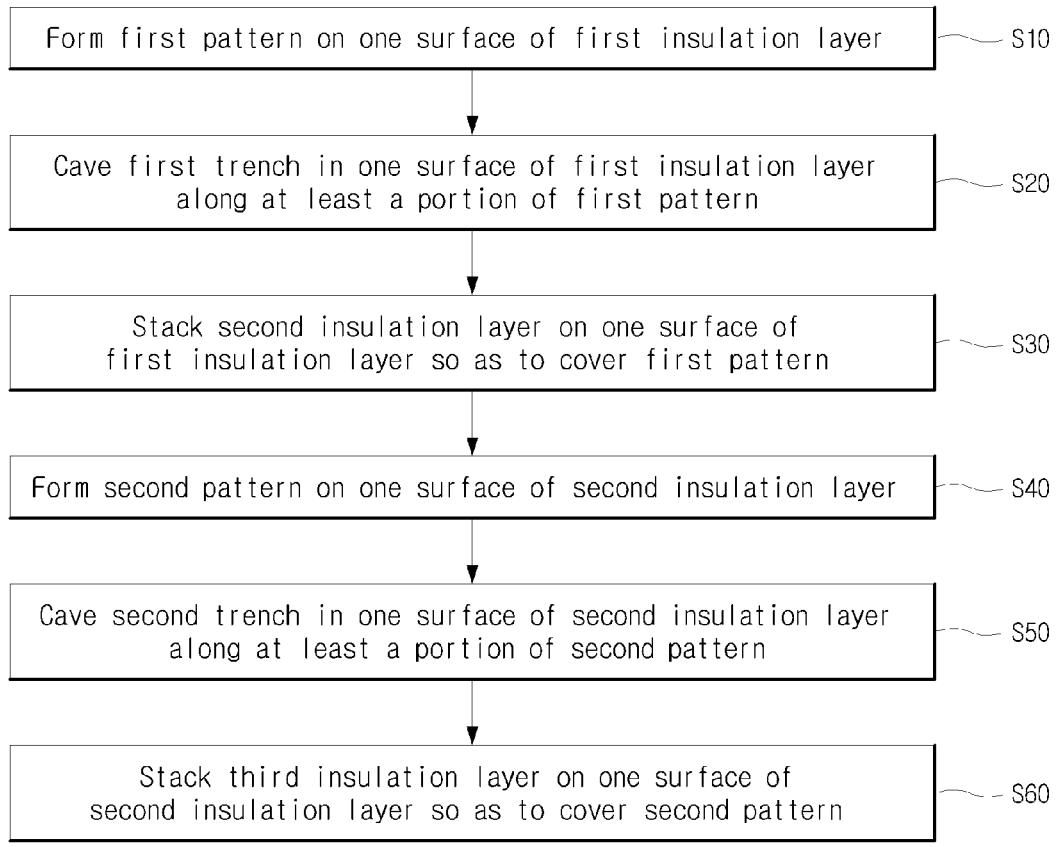
FIG. 6 is a flow diagram illustrating an embodiment of a manufacturing method of the printed circuit board in accordance with another aspect of the present invention.

FIG. 6 is a flow diagram illustrating an embodiment of a manufacturing method of the printed circuit board in accordance with another aspect of the present invention, and FIGS. 7 to 12 are process diagrams illustrating an embodiment of a manufacturing method of the printed circuit board in accordance with another aspect of the present invention. Illustrated in FIGS. 7 to 12 are the first insulation layer 100, the base layer 100A, the medium layer 100B, the first pattern 110, the first trench 120, the second insulation layer 200, the second pattern 210, the second trench 220 and the third insulation layer 300.

Figure 7:
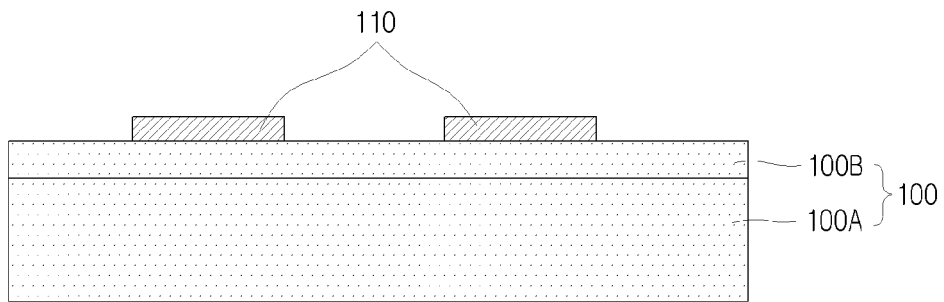
FIGS. 7 to 12 are process diagrams illustrating an embodiment of a manufacturing method of the printed circuit board in accordance with another aspect of the present invention.

First, as shown in FIG. 7, the first pattern 110 is formed on one surface of the first insulation layer 100 (S10). Used for the first insulation layer 100 in the present embodiment is a material having the structure in which the base layer 100A and the medium layer 100B are stacked. However, the present invention is not restricted to this embodiment, and it is possible that a core board in which a reinforcing material, such as glass fiber or carbon fiber, is impregnated in an epoxy resin, or an individual insulation layer carrying out an inter-layer insulation function in a multi-layer printed circuit board, is used for the first insulation layer 100. Moreover, the first insulation layer 100 can be a substrate or an interposer that uses ceramic or silicon.

In order to form the first pattern 110 on the first insulation layer 100, it is possible to proceed with a plating process or stack a metal thin film before selectively etching the metal thin film. Moreover, it is possible that printing is made directly on the first insulation layer 100 using an inkjet head and conductive ink.

Figure 8:
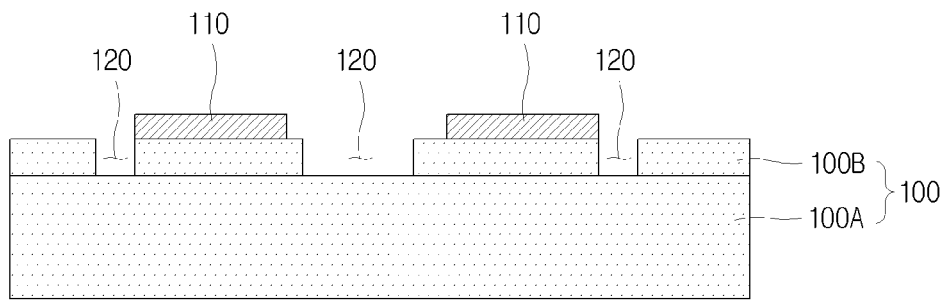

Then, as shown in FIG. 8, the first trench 120 is caved in one surface of the first insulation layer 100 along at least a portion of the first pattern 110 (S20). Although FIG. 8 shows that the first trench 120 is formed in the medium layer 100B only, it shall be possible that the first trench 120 is formed in the base layer 100A as well if necessary. A laser processing method using an excimer laser can be used in order to form the first trench 120 on the first insulation layer 100. In addition, various dry etching methods or wet etching methods can be used.

Here, as shown in FIG. 3, and as described earlier, the first pattern 110 can include a plurality of wired lines 110A, 110B that are separated from one another, and the first trench 120A, 120B can be formed between the plurality of wired lines 110A, 110B. Moreover, as described earlier, in case the distances between the plurality of wired lines 110A, 110B are not constant, the width of the first trench 120A, 120B can vary according to the distance between the plurality of wired lines 110A, 110B.

As illustrated in FIG. 4, in case the first pattern 110 includes a plurality of parts 110-1, 110-2 that are functionally distinguishable, the first trench 120 can be formed along a border between the adjacent parts 110-1, 110-2. Moreover, as illustrated in FIG. 5, and as described earlier, the first trench 120-1, 120-2, 120-3, 120-4, 120-5 can be formed to surround at least one of a plurality of parts 110-1, 110-2, 110-3, 110-4, 110-5.

Figure 9:
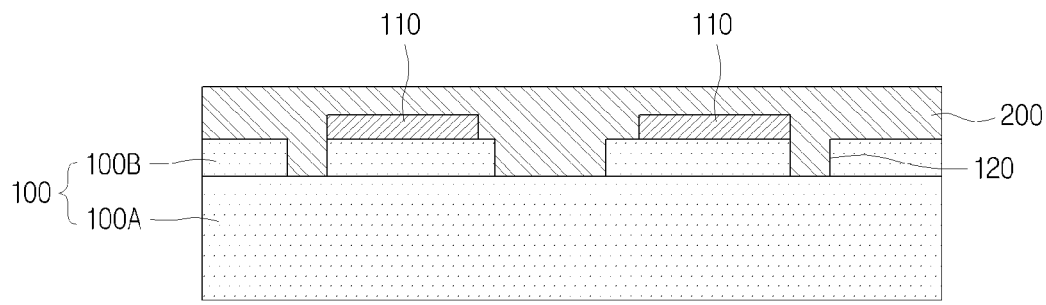
Figure 10:
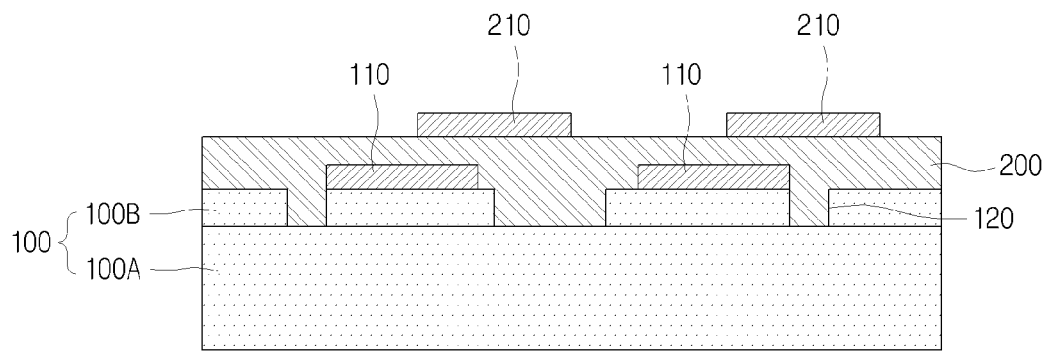

Then, as illustrated in FIG. 9, the second insulation layer 200 is stacked on one surface of the first insulation layer 100 so as to cover the first pattern 110 (S30). Here, the first trench 120 is filled by the second insulation layer 200. In case the materials for the first insulation layer 100 and the second insulation layer 200, more specifically, the materials for the medium layer 100B and the second insulation layer 200, are different from each other, the first trench 120 formed in the first insulation layer 100 can function as a stress buffer between the materials.

Figure 11:
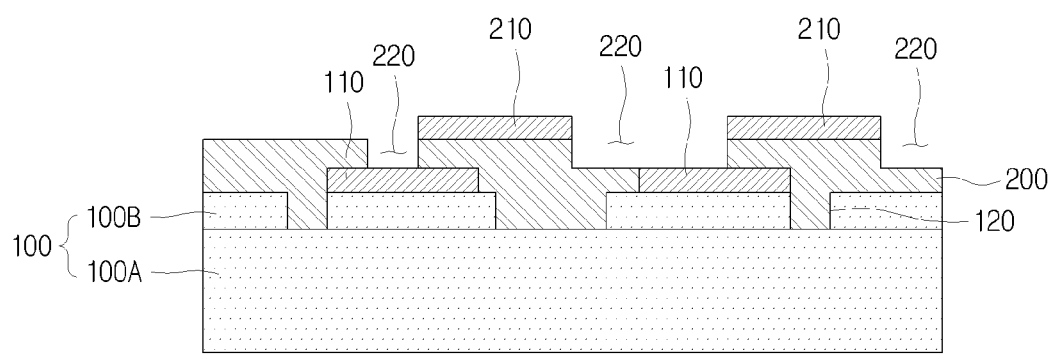
Figure 12:
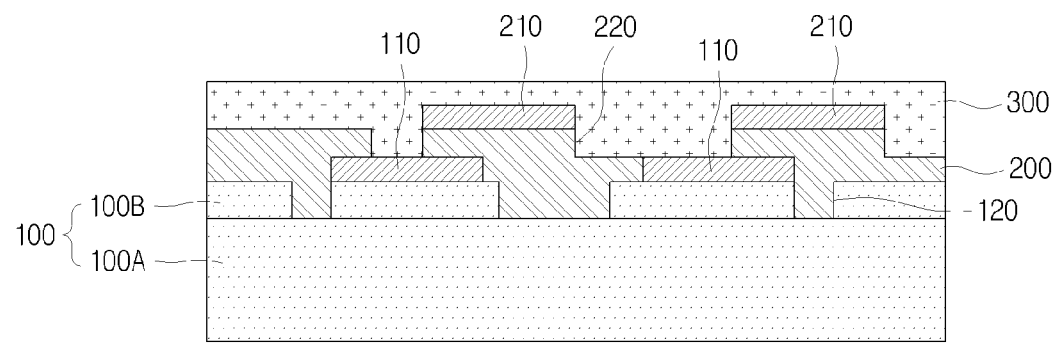

Afterwards, the second pattern 210 is formed on one surface of the second insulation layer 200 (S40, FIG. 10), and the second trench 220 is caved in one surface of the second insulation layer 200 along at least a portion of the second pattern 210 (S50, FIG. 11). Then, the third insulation layer 300 can be stacked on one surface of the second insulation layer 200 so as to cover the second pattern 210 (S60, FIG. 12). Here, the second trench 220 is filled by the third insulation layer 300.

Through the above processes, the structure with circuit patterns and trenches can be repeatedly formed in a multi-layer printed circuit board.

Although certain embodiments of the present invention have been described, it shall be appreciated by anyone ordinarily skilled in the art to which the present invention pertains that there can be a variety of permutations and modifications of the present invention without departing from the technical ideas and scopes of the present invention that are disclosed in the claims appended below.

A large number of embodiments in addition to the above-described embodiments are present within the claims of the present invention.

What is claimed is:

1. A printed circuit board comprising:
    a first insulation layer having a first pattern formed thereon;
    a first trench caved in one surface of the first insulation layer along at least a portion of the first pattern; and
    a second insulation layer stacked on one surface of the first insulation layer so as to cover the first pattern,
    wherein the first trench is filled by the second insulation layer,
    the second insulation layer is integrally formed on the first insulation layer and the first pattern such that a portion of the second insulation layer fills the first trench,
    the first insulation layer comprises:
        a base layer made of an insulation material; and
        a medium layer formed on the base layer and made of an insulation material,
    the first pattern and the first trench are formed on the medium layer,
    the first trench is formed by penetrating the medium layer such that a portion of the base layer is exposed by the first trench, and
    the medium layer is made of a different insulation material from the base layer.

2. The printed circuit board of claim 1, wherein materials for the first insulation layer and the second insulation layer are different from each other.

3. The printed circuit board of claim 1, further comprising:
    a second pattern formed on one surface of the second insulation layer;
    a second trench caved in one surface of the second insulation layer along at least a portion of the second pattern; and
    a third insulation layer stacked on one surface of the second insulation layer so as to cover the second pattern,
    wherein the second trench is filled by the third insulation layer.

4. The printed circuit board of claim 1, wherein the first insulation layer is a core board.

5. The printed circuit board of claim 1, wherein:
    the first pattern comprises a plurality of wired lines that are separated from one another; and
    the first trench is formed between the plurality of wired lines.

6. The printed circuit board of claim 5, wherein:
    distances between the plurality of wired lines are not constant; and
    the width of the first trench varies according to the distance between the plurality of wired lines.

7. The printed circuit board of claim 1, wherein:
    the first pattern comprises a plurality of parts that are functionally distinguishable; and
    the first trench is formed along a border of adjacent parts.

8. The printed circuit board of claim 1, wherein:
the first pattern comprises a plurality of parts that are functionally distinguishable; and
the first trench is formed to surround at least one of the plurality of parts.

\* \* \* \* \*